(12) United States Patent
Klingler

(10) Patent No.: US 11,057,998 B2
(45) Date of Patent: Jul. 6, 2021

(54) METHOD FOR THE SPACED CONNECTION OF PRINTED CIRCUIT BOARDS AS WELL AS INSTALLATION UNIT AND INSTALLATION ASSEMBLY

(71) Applicant: Würth Elektronik eiSos GmbH & Co. KG, Waldenburg (DE)

(72) Inventor: Stefan Klingler, Michelbach (DE)

(73) Assignee: Würth Elektronik eiSos GmbH & Co. KG, Waldenburg (DE)

( * ) Notice: Subject to any disclaimer, the term of this patent is extended or adjusted under 35 U.S.C. 154(b) by 0 days.

(21) Appl. No.: 16/555,581

(22) Filed: Aug. 29, 2019

(65) Prior Publication Data

US 2020/0077516 A1  Mar. 5, 2020

(30) Foreign Application Priority Data

Aug. 30, 2018  (DE) .......................... 10 2018 214 770

(51) Int. Cl.
  *H05K 1/11* (2006.01)
  *H05K 1/14* (2006.01)
  *H05K 3/36* (2006.01)

(52) U.S. Cl.
  CPC .............. *H05K 1/14* (2013.01); *H05K 3/363* (2013.01); *H05K 3/368* (2013.01)

(58) Field of Classification Search
  CPC .......... H05K 1/14; H05K 3/363; H05K 3/368; H05K 7/142; H05K 1/144; H01R 12/73
  See application file for complete search history.

(56) References Cited

U.S. PATENT DOCUMENTS

| | | | | |
|---|---|---|---|---|
| 6,140,591 A | * | 10/2000 | Osborne | H05K 7/142 174/138 E |
| 2010/0178796 A1 | * | 7/2010 | Ishii | H01R 13/73 439/527 |
| 2013/0141852 A1 | * | 6/2013 | Chen | H05K 7/142 361/679.4 |
| 2016/0226233 A1 | | 8/2016 | Chen | |
| 2016/0315398 A1 | | 10/2016 | Peters et al. | |
| 2016/0330849 A1 | * | 11/2016 | Brodbeck | F16B 21/082 |

FOREIGN PATENT DOCUMENTS

| | | |
|---|---|---|
| DE | 102014222951 A1 | 5/2016 |
| JP | 2001349315 | * 12/2001 |
| JP | 2001349315 A | 12/2001 |
| TW | 201507285 A | 2/2015 |
| TW | M505088 U | 7/2015 |
| TW | 201618377 A | 5/2016 |
| WO | 2016053501 A1 | 4/2016 |

* cited by examiner

*Primary Examiner* — Yuriy Semenenko
(74) *Attorney, Agent, or Firm* — McGlew and Tuttle, P.C.

(57) ABSTRACT

A method for the spaced connection of printed circuit boards is described. For this purpose, the printed circuit boards and at least one installation unit including one distance element and one laminar cover element, respectively, as well as one fixing element per installation unit are provided. The distance element is positioned and fixed on the first printed circuit board. Subsequently, the cover element is penetrated in the region of an intake opening of the distance element. The fixing element is inserted into the intake opening and connected with the second printed circuit board. Further on, an installation element and an installation assembly for the spaced connection of two printed circuit boards are described.

22 Claims, 8 Drawing Sheets

METHOD FOR THE SPACED CONNECTION OF PRINTED CIRCUIT BOARDS AS WELL AS INSTALLATION UNIT AND INSTALLATION ASSEMBLY

CROSS-REFERENCE TO RELATED APPLICATIONS

This application claims the priority of German Patent Application, Serial No. DE 10 2018 214 770.1, filed on Aug. 30, 2018, pursuant to 35 U.S.C. 119(a)-(d), the content of which is incorporated herein by reference in its entirety as if fully set forth herein.

FIELD OF THE INVENTION

The invention relates to a method for the spaced connection of printed circuit boards. Further on, the invention relates to an installation unit and an installation assembly for the spaced connection of printed circuit boards.

BACKGROUND OF THE INVENTION

A method for the spaced connection of printed circuit boards and an appropriate fixing device are known, for example, from DE 10 2014 222 951 A1.

SUMMARY OF THE INVENTION

An object of the present invention is to improve a method for the spaced connection of printed circuit boards, in particular to configure same in a more flexible, more efficient and more precise manner.

This object is achieved by a method including the steps providing at least one installation unit comprising, a distance element having an intake opening and a cover element, which covers the intake opening, a fixing element per installation unit, a first printed circuit board and a second printed circuit board to be connected with the first printed circuit board, positioning and fixing the distance element on the first printed circuit board, penetrating the cover element in the region of the intake opening, inserting the fixing element into the intake opening, and connecting the second printed circuit board with the first printed circuit board by means of the fixing element. First of all, at least one installation unit comprising a distance element, showing an intake opening, and a laminar cover element, which covers the intake opening, is provided. Additionally, one fixing element per installation unit is provided. Further on, a first printed circuit board and a second printed circuit board to be connected therewith are provided. The distance element is positioned on the first printed circuit board and fixed thereon. Subsequently, the cover element is penetrated in the region of the respective intake opening. The fixing element is inserted into the intake opening and connected with the second printed circuit board.

According to the invention, it has been found that the cover element covering the intake opening allows for a simple positioning and fixing of the distance element on the first printed circuit board. The intake opening does not hinder the handling and the installation of the distance element. In particular, it is not necessary to connect the fixing element with the distance element at first. The distance element is positioned and fixed independently from the respective fixing element, which increases the flexibility and the precision of the method. Due to the cut-through of the cover element in the region of the respective intake opening, the fixing element can be inserted into the intake opening without having to remove the cover element. The cover element does not hinder the insertion of the fixing element. Due to this, a time-consuming and error-prone removal of the cover element is avoided. The fixing element can be inserted into the intake opening in a simple manner. The method is efficient.

After the insertion of the fixing element into the intake opening, the fixing element and the distance element configure a fixing device. Preferably, the distance element and the fixing element are positively connected due to the insertion of the fixing element into the intake opening, which creates a stable fixing device. For the spaced connection of the printed circuit boards, one single fixing device is sufficient. Preferably, however, multiple fixing devices including one distance element and one fixing element, respectively, are used. The method steps necessary for this are the same for each fixing device or the respective installation unit as well as the associated fixing element and they can be carried out independently from further fixing devices. In the following, the method steps are thus described for one single installation unit and the associated fixing element only.

The cover element is configured in a planar manner. This means that the cover element extends in a plane and has an extension in the plane, which exceeds a thickness of the cover element perpendicular to the plane many times over. The laminar cover element covers the intake opening at least partially, preferably entirely. Due to this, the intake opening, in particular, is closed, in particular tightly closed, at least on one side. The intake opening does hinder neither the handling and the positioning nor the fixing of the distance element.

The distance element, preferably, has a main extension along a central longitudinal axis. This means that a cross section of the distance element perpendicular to the central longitudinal axis is smaller than its length along the central longitudinal axis. The intake opening—if applicable—preferably is configured on a front side of the distance element. Especially preferably, the intake opening is located opposite to an end of the distance element which is fixed to the first printed circuit board. The distance element, essentially, can be configured in a cylindrical, in particular circular cylindrical manner around the central longitudinal axis. The distance element can be provided in different lengths in order to allow for a different spacing of the printed circuit boards to be connected, according to the requirements.

The distance element can have an insertion section, which is insertable into a corresponding bore of the first printed circuit board. Due to this, a simple, precise and reliable positioning and fixing of the distance element on the first printed circuit board is ensured.

The intake opening can be configured as a through bore along the central longitudinal axis of the distance element. Alternatively, the intake opening can also be configured as a blind bore.

The fixing element, preferably, has a main extension along a central longitudinal axis. Especially preferably, the distance element and the fixing element have corresponding central longitudinal axes, which, after these elements have been connected to configure the fixing device, configure a common central longitudinal axis of the fixing device.

The fixing element, preferably, has a first fixing section for the insertion into the intake opening and/or a second fixing section for the connection with the second printed circuit board. The first fixing section and the second fixing section can be arranged on opposite ends of the fixing element, located along the central longitudinal axis of the fixing element.

The second fixing section, for example, is configured as a latching device, which is insertable into a corresponding bore of the second printed circuit board, for connecting the second fixing section with the second printed circuit board, and latches therein. Alternatively, the second fixing section can be configured as a holding device, for example as a screw head, which holds the second printed circuit board on a holding surface, for example against the front side of the distance element.

The first fixing section, preferably, is configured corresponding to the intake opening. Due to an insertion of the first fixing section into the intake opening, in particular, a positive connection of the fixing element and the distance element is possible. The intake opening, in particular, can be configured for latching, screwing or pressing in of the first fixing section therein. For example, the intake opening can have a female thread. If applicable, the first fixing section can be configured as a screw having a male thread corresponding to the female thread of the intake opening. Alternatively, it is possible to configure the first fixing section as a support pin comprising support pin latching projections, which, for example, are adapted to a female thread of the intake opening.

Preferably, the fixing element is configured in one piece. The fixing element thus can be produced in a cost-effective manner and is stable. In an especially feasible embodiment, the fixing element is configured as a screw. If applicable, the screw thread, as a first fixing section, can be screwed in the intake opening. The screw head can serve as a second fixing section, which holds the second printed circuit board, in particular against the distance element.

For example, the fixing element can be made in one piece of a plastic material. The plastic material electrically insulates the printed circuit boards that are connected with each other. Additionally, a simple and integral embodiment of latching elements for the first fixing section as well as for the second fixing section is possible. Alternatively, the fixing element can also be made of a metal. In this case, the fixing element, in particular its second fixing section, can be soldered with the printed circuit board. Additionally or alternatively, a soldering of the fixing element, in particular of its first fixing section, with the distance element is possible.

The cut-through of the cover element, for example, can take place mechanically or pneumatically. In particular, the cover element can be pierced with a perforation device, for example a spike. Alternatively, the cut-through can take place by means of an air pressure beam. After the cut-through of the cover element, the intake opening is released at least as far as possible, with the result that the first fixing section of the fixing element can be inserted.

A method wherein the cover element is penetrated in the region of the intake opening with the help of the fixing element is efficient and cost-saving. If the cover element is penetrated in the region of the intake opening by the fixing element, in particular its first fixing section, an additional perforation device can be dispensed with. The cut-through of the cover element, especially preferably, takes place during the insertion of the fixing element, in particular the first fixing section, into the intake opening. Then, an additional method step for cutting through the cover element is not necessary. A further advantage of the cut-through of the cover element during the insertion of the fixing element, in particular the first fixing section, is that pieces or fragments, which result from the cut-through of the cover element, are pressed into the intake opening and can be held there. An uncontrolled detaching of the pieces and/or fragments of the cover element is avoided.

A method wherein the installation unit, for the positioning and fixing of the distance element on the first printed circuit board, is held, preferably held pneumatically, on the cover element by means of an installation device is flexible and precise. The holding of the installation unit, with the help of an installation device, on the cover element allows for a simple mechanical handling and positioning of the installation unit. For example, the cover element can be magnetic, in particular have magnetic particles, with the result that a magnetic holding of the installation unit on the cover element is possible. Preferably, however, the cover element serves as a suction element, especially preferably as a suction foil, with the result that the installation unit can be held pneumatically. Here, a negative pressure is produced by the installation device by means of suction. The cover element ensures that the negative pressure between the installation device and the installation unit can be produced and that there is no pressure equalization via the intake opening. If the cover element does not cover the intake opening in a fluid-tight manner, small leakage flows may develop. These leakage flows, also named as false air, however, can be compensated by an according adaptation of the suction, and therefore are tolerable. Small leakage flows, for example, can develop when the cover element has a perforation.

A method wherein the distance element is soldered with the first printed circuit board allows for a stable connection of the distance element with the first printed circuit board. For soldering the distance element with the first printed circuit board, the distance element, preferably entirely, is made of a solderable material, especially preferably made of metal in one piece. This increases the stability of the distance element and thus of the connection with the printed circuit board.

A method wherein the cover element is located within a cross-sectional surface of the distance element, measured in the region of the intake opening is especially precise and efficient. The cover element located within the cross section of the distance element, measured in the region of the intake opening, does not protrude beyond the cross section of the distance element. In particular, the cover element has no tear-off lug. The cross section of the installation unit thus is limited by the cross section of the distance element. The cover element does not block a, in particular visual, control during and/or after the positioning and/or fixing. The distance element can be positioned and fixed with an increased precision. The error rate and thus the reject are reduced. A further advantage is that the cross section of the installation unit is not enlarged by the cover element. Due to this, a tighter positioning of multiple installation units is possible on the first printed circuit board.

The distance element, in particular, is configured essentially cylindrically around the central longitudinal axis. The cross-sectional surface of the distance element, if applicable, is the base surface of the cylinder. Preferably, the distance element is configured essentially circular cylindrically around the central longitudinal axis, with the result that the cross-sectional surface of the distance element is circular. In this case, a maximum extension of the cover element can be between 70% and 100%, in particular between 85% and 95% of the diameter of the circular cross section. Especially preferably, the cover element is configured circularly, as well, with a diameter corresponding to the maximum extension. This ensures that the cover element does not protrude beyond the cross-sectional surface of the distance element and at the same time entirely covers the intake opening.

A method wherein the cover element is applied onto the distance element as a foil, in particular an adhesive foil is efficient and cost-saving. The cover element can be applied, in particular glued, onto the distance element in a simple manner Corresponding foils, in particular adhesive foils, are inexpensive. Especially preferably, polyimide foils are used. Cover elements that are configured as foils further on have the advantage that they can be easily penetrated or pierced through. Due to this, the method is simplified.

The cover element, in particular a cover element configured as a foil, for example, can have a thickness between 0.03 mm and 1 mm, in particular between 0.05 mm and 0.5 mm. The thickness of the cover element can be composed of a foil thickness and the thickness of an adhesive layer. An exemplary foil thickness is between 0.03 mm and 0.35 mm, in particular between 0.03 mm and 0.1 mm. The thickness of an adhesive layer can be between 0.02 mm and 0.1 mm, in particular between 0.04 mm and 0.075 mm. An exemplary cover element can have a foil thickness of 0.03 mm and an adhesive layer of 0.04 mm. Cover elements of low thickness can easily be penetrated or pierced through.

A method wherein the cover element has at least one predetermined breaking point in the region of the intake opening allows for a simple cut-through of the cover element. The at least one predetermined breaking point in the region of the intake opening can be configured by a material weakening, for example by material removal or the provision of notches and/or a perforation. Alternatively, the predetermined breaking point can also be realized by tensions within the cover element. Cover elements provided with a predetermined breaking point can easily be penetrated or pierced through. In particular, the cut-through of the cover element can take place with the help of the first fixing section of the fixing element. A perforation device is not necessary for the cut-through of the cover element.

The predetermined breaking point, for example, can be configured by sectionally different thicknesses of the cover element, in particular by different foil thicknesses of a cover element configured as a foil. Different thicknesses, for example, can be achieved by material removal with the help of a laser and/or by etching.

If the predetermined breaking point has a perforation of the cover element, small leakage flows can develop during the pneumatic holding, which, however, can be corrected. Due to an alternative embodiment of the predetermined breaking point, in which the cover element, also in the region of the predetermined breaking point, does not have through holes, the holding, in particular the pneumatic holding, of the installation unit on the cover element can be further simplified and improved.

A method wherein the at least one predetermined breaking point is configured as a notch and/or perforation of the cover element is particularly efficient and cost-saving. Preferably, the at least one predetermined breaking point is only realized by the at least one notch and/or perforation. The notch and/or perforation can be provided in a simple manner by piercing, carving and/or stamping in the cover element. A material removal is not necessary. The notch and/or the perforation, preferably, runs radially starting from a central point.

A method comprising a control step for the control of the positioning and/or the fixing of the distance element on the first printed circuit board is reliable and cost-saving. The control step ensures that erroneously positioned and/or fixed distance elements can be identified at an early stage. If needed, erroneously positioned distance elements can be removed and/or replaced. Due to this, the reject of the method is reduced. The control step for the control of the positioning and/or fixing is especially reliable, if the cover element does not protrude beyond the cross-sectional surface of the distance element, as it has been described above. By this means, an exact control, in particular visual control, of the positioning and/or fixing is possible.

Another object of the invention is to provide an improved installation unit for the spaced connection of two printed circuit boards.

This object is achieved by an installation unit for the spaced connection of two printed circuit boards, having a distance element including an intake opening for receiving a fixing element and a cover element, which covers the intake opening. The installation unit has a distance element comprising an intake opening for receiving a fixing element, in particular a first fixing section of the fixing element. A laminar cover element covers the intake opening. Due to this, the handling of the installation unit is improved. In particular, the installation unit, despite the intake opening of the distance element, can be held, in particular be pneumatically held, on the laminar upper side of the cover element. The installation unit is applicable in the method described above. The advantages of the installation unit correspond to the advantages of the method.

An installation unit wherein the cover element is configured as a foil, in particular as an adhesive foil, is cost-saving and simple in production as well as flexibly applicable. The cover element configured as a foil can be applied, in particular glued, onto the distance element in a simple manner Especially preferably, the cover element is a polyimide foil.

An installation unit wherein the cover element has a thickness between 0.03 mm and 1 mm, in particular between 0.05 mm and 0.5 mm, can be applied particularly flexibly. The low thickness of the cover element allows for a simple cut-through of the cover element. In particular, the cover element can be penetrated during the insertion of the first fixing section of the fixing element into the intake opening. The thickness of a cover element configured as a foil, in particular an adhesive foil, can be composed of the thickness of an adhesive layer and a foil thickness, as it is described above with reference to the method.

The cover element of an installation unit, wherein the cover element has at least one predetermined breaking point in the region of the intake opening, can be penetrated particularly easily. A perforation device for cutting through the cover element is not necessary. With regard to the further advantages and embodiments of the predetermined breaking point, reference is made to the description above with regard to the method.

An installation unit wherein the at least one predetermined breaking point is configured as a notch and/or perforation of the cover element can be produced in a simple manner and is cost-efficient. The notch and/or perforation can be inserted into the cover element in a simple manner.

An installation unit comprising a plurality of predetermined breaking points ensures a high reliability and safety. Due to a plurality of predetermined breaking points, the fracture behavior of the cover element can be controlled precisely. Pieces or fragments of the cover element can be adjusted in their size and distribution due to this. In particular, it is ensured that the pieces and/or fragments of the cover element cannot entirely detach, but remain connected with the cover element. Especially preferably, the pieces or fragments can be pressed to the inner side of the intake opening without hindering the insertion of the first fixing section of the fixing element. A plurality of predetermined breaking points, in addition, again simplifies the cut-through of the cover element. Especially preferably, the predetermined breaking points are each carved, pierced or stamped as a notch into the cover element.

The multiple predetermined breaking points, preferably, are arranged corresponding to the shape of the cover element, in particular symmetrically. In particular in the case of a circular cover element, the predetermined breaking points, for example, can be arranged in a star-shaped manner, starting from a central point of the cover element. Alternatively, the predetermined breaking points can be arranged in the form of a grid, in particular a rectangular grid, in the cover element. Yet alternatively, the predetermined breaking points can correspond to the shape of the intake opening. In the case of an intake opening with a circular cross section, the predetermined breaking points, for example, can be arranged along a circular line corresponding to the cross section of the intake opening. In addition to this, predetermined breaking points starting radially from the central point of the circle can exist. These radially arranged predetermined breaking points can divide the circle described by the circular line preferably into uniform circle segments, in particular into two, three, four or more circle segments.

An installation unit wherein the cover element is located within a cross-sectional surface of the distance element, measured in the region of the intake opening allows for a precise positioning and fixing of the cover element on a printed circuit board. The cover element does not protrude beyond the cross-sectional surface of the distance element measured in the region of the intake opening. The cover element thus does not hinder a, in particular visual, control during and/or after the positioning and fixing of the distance element on the printed circuit board. Additionally, multiple installation units can be positioned close together on the printed circuit board.

An installation unit wherein the distance element is made of metal in one piece is stable. In particular, the distance element is suitable for being soldered with the printed circuit board. Due to this, the connection of the distance element with the printed circuit board is improved, as well. A metallic distance element further on improves the heat dissipation from the printed circuit board. Especially preferably, the distance element is made of steel, A2 high grade steel, brass and/or aluminum.

Yet another object of the invention is to provide an improved installation assembly for the spaced connection of two printed circuit boards.

This object is achieved by an installation assembly for the spaced connection of two printed circuit boards, having an installation unit comprising a distance element having an intake opening and a cover element, which covers the intake opening, and a fixing element. The installation assembly comprises an installation unit and a fixing element. The installation unit has a distance element comprising an intake opening and a laminar cover element, which covers the intake opening. The fixing element, in particular, has a first fixing section corresponding to the intake opening of the distance element and a second fixing section. The installation unit and the fixing element are separate from each other. They can be connected to configure a fixing device by insertion of the fixing element, in particular its first fixing section, into the intake opening. The installation assembly is suitable for the execution of the method described above. The further characteristics and advantages of the installation assembly correspond to those already described above with regard to the installation unit.

Further features, advantages and details of the invention arise from the following description of several exemplary embodiments.

DESCRIPTION OF THE PREFERRED EMBODIMENTS

Figure 1:
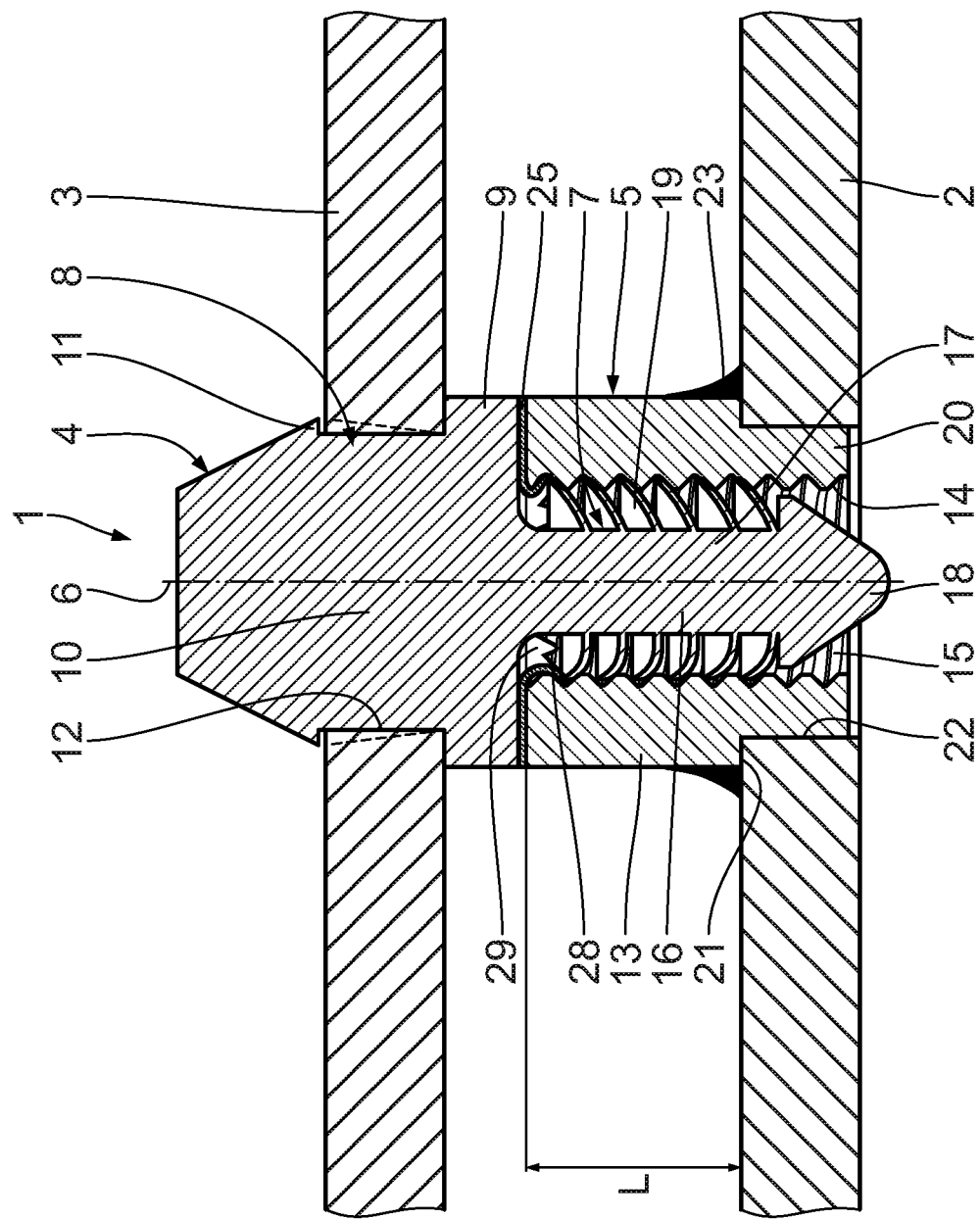
FIG. 1 shows a section through a fixing device, which connects two printed circuit boards with each other in a spaced manner.

In FIG. 1, a section through a fixing device 1 is shown, via which a first printed circuit board 2 is connected with a second printed circuit board 3 in a spaced manner. The fixing device 1 comprises a fixing element 4 and a distance element 5. The fixing element 4 and the distance element 5 are positively connected to configure the fixing device 1. The fixing element 4 and the distance element 5 each have a central longitudinal axis 6, which run in a parallel manner and define a corresponding central longitudinal axis 6 of the fixing device 1. The printed circuit boards 2, 3 extend in a parallel manner relative to one another in planes which run perpendicularly to the central longitudinal axis 6. The printed circuit boards 2, 3 are thus spaced from each other in the direction of the central longitudinal axis 6 due to the fixing device 1.

The fixing element 4 has a first fixing section 7 and a second fixing section 8 opposite to the first fixing section 7 in the direction of the central longitudinal axis 6. Between the fixing sections 7, 8 of the fixing element 4, a central section 9 is arranged. The fixing element 4 is configured in one piece of plastic material.

The central element 9 is configured in a circular discoidal manner around the central longitudinal axis 6. The second fixing section 8 extends, starting from the central section 9, concentrically to the central longitudinal axis 6. The second fixing section 8 has a cylindrical base body 10, whose radius is tapered against the central section 9. On the end of the cylindrical base body 10 opposite to the central section 9, there is a latching projection 11 running concentrically around the central longitudinal axis 6, which radially protrudes beyond the cylindrical base body 10. The latching projection 11 is configured elastically. The printed circuit board 3 has a circular opening 12, whose diameter is adapted to the diameter of the cylindrical base body 10. The latching projections 11 are configured in a barb-shaped manner, with the result that the printed circuit board 3 can be guided from above over the latching projections 11 and is held in the region of the cylindrical base body 10 between the latching projections 11 and the central section 9. The second fixing section 8 thus is configured as a latching device, which is latched with the second printed circuit board 3. In other embodiments that are not shown, the fixing element, in particular the second fixing section, is configured differently. With regard to alternative embodiments of the fixing element, in particular of the second fixing section for fixing the second printed circuit board 3, reference is made to DE 10 2014 222 951 A1.

The distance element 5 is made of metal in one piece. The distance element 5 essentially is configured as a circular cylindrical sleeve body 13 concentrically around the central longitudinal axis 6. The sleeve body 13 has a length L in the direction of the central longitudinal axis 6. In the distance element 5, an intake opening 14 extending along the central longitudinal axis 6 is configured. The intake opening 14 is concentric to the central longitudinal axis and extends as a through bore along the entire distance element 5 in the direction of the central longitudinal axis 6. In the intake opening 14, a female thread 15 is configured.

The first fixing section 7 is arranged on the side of the central section 9 opposite to the second fixing section 8. The first fixing section 7 is configured corresponding to the intake opening 14 and the female thread 15. The first fixing section 7 has a support pin 16 extending along the central longitudinal axis 6. The support pin 16 has a cylindrical support pin base body 17 and a support pin tip 18 facing away from the central section 9. The support pin tip 18 tapers towards the free end of the support pin 16. On the support pin base body 17, support pin latching projections 19 are configured, which are formed corresponding to the female thread 15. The support pin latching projections 19 are configured in a plate-shaped manner and mesh with the female thread 15. Due to this, the first fixing section 7 latches in the intake opening 14, with the result that a positive connection between the fixing element 4 and the distance element 5 is established.

At its end facing away from the fixing element 4, the distance element 5 has an annular insertion section 20. The insertion section 20 is tapered against the sleeve body 13, with the result that a printed circuit board stop 21 is configured on the passage from the sleeve body 13 to the insertion section 20. The insertion section 20 is inserted in a corresponding reception bore 22 of the first printed circuit board 2, with the result that the printed circuit board stop 21 abuts on the surface of the first printed circuit board 2. The distance element 5 is soldered to the first printed circuit board 2 with the help of the soldering agent 23.

The fixing device 1 allows for a stable spaced connection of the printed circuit boards 2, 3. The fixing device 1 is configured in two pieces of the distance element 5 and the fixing element 4. The two-piece configuration of the fixing device 1, on the one hand, has the advantage that the metallic distance element 5 can be connected with the first printed circuit board 2 in a stable manner by soldering, wherein, at the same time, due to the fixing element 4 made of plastic material, an electric insulation is ensured between the printed circuit boards 2, 3. A further advantage of the two-piece configuration is that the fixing device 1 can be adapted to a desired distance of the printed circuit boards 2, 3 in a simple manner. As can be seen from FIG. 1, the distance of the printed circuit boards 2, 3 in the direction of the central longitudinal axis 6 essentially is determined by the length L of the sleeve body 13 of the distance element 5. The fixing device 1 thus can be adapted to the respective application in a simple manner by choosing a distance element 5 with an appropriate length L of the sleeve body 13.

Figure 2:
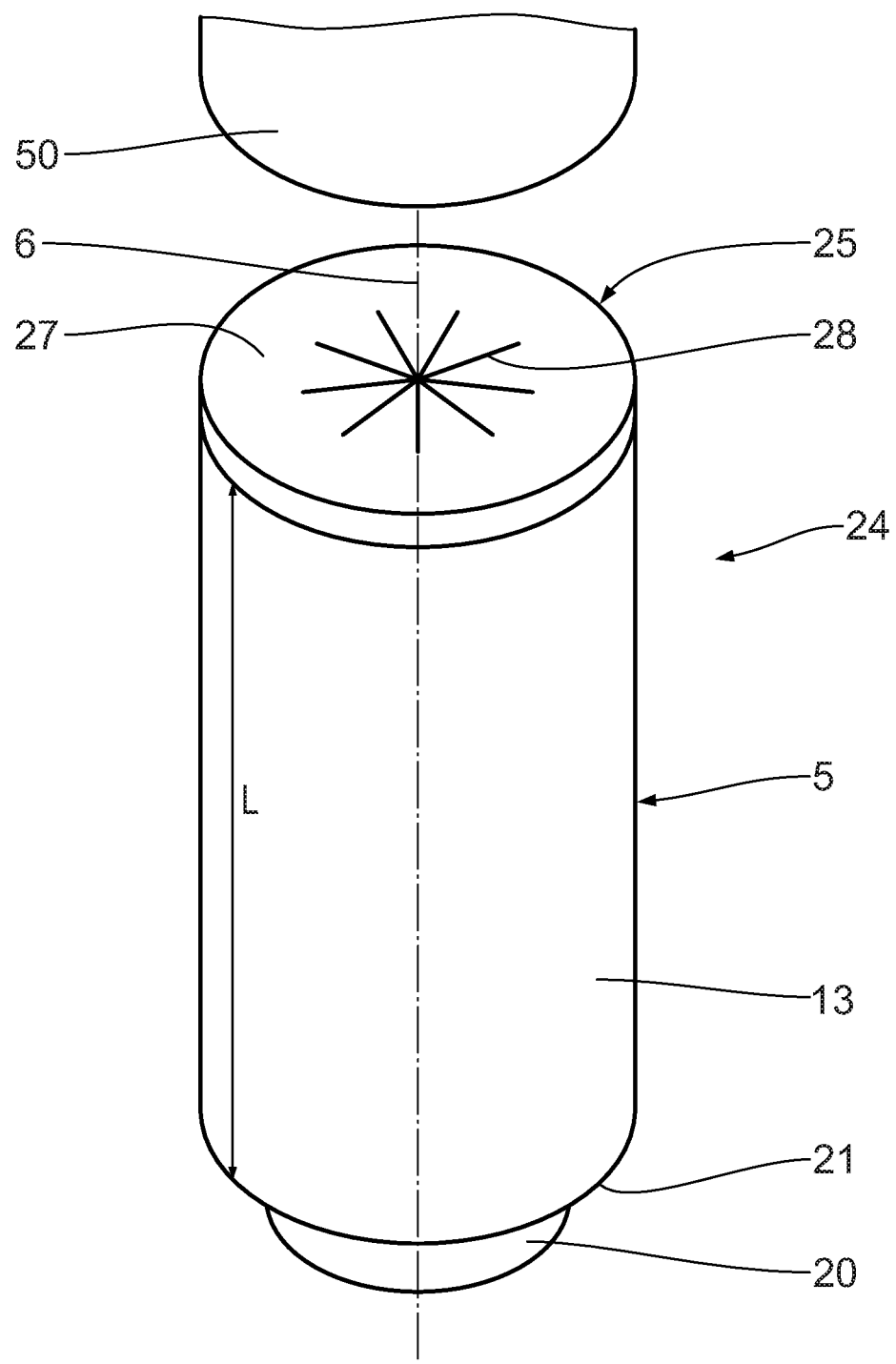
FIG. 2 shows a perspective view of an installation unit for the spaced connection of printed circuit boards.
Figure 3:
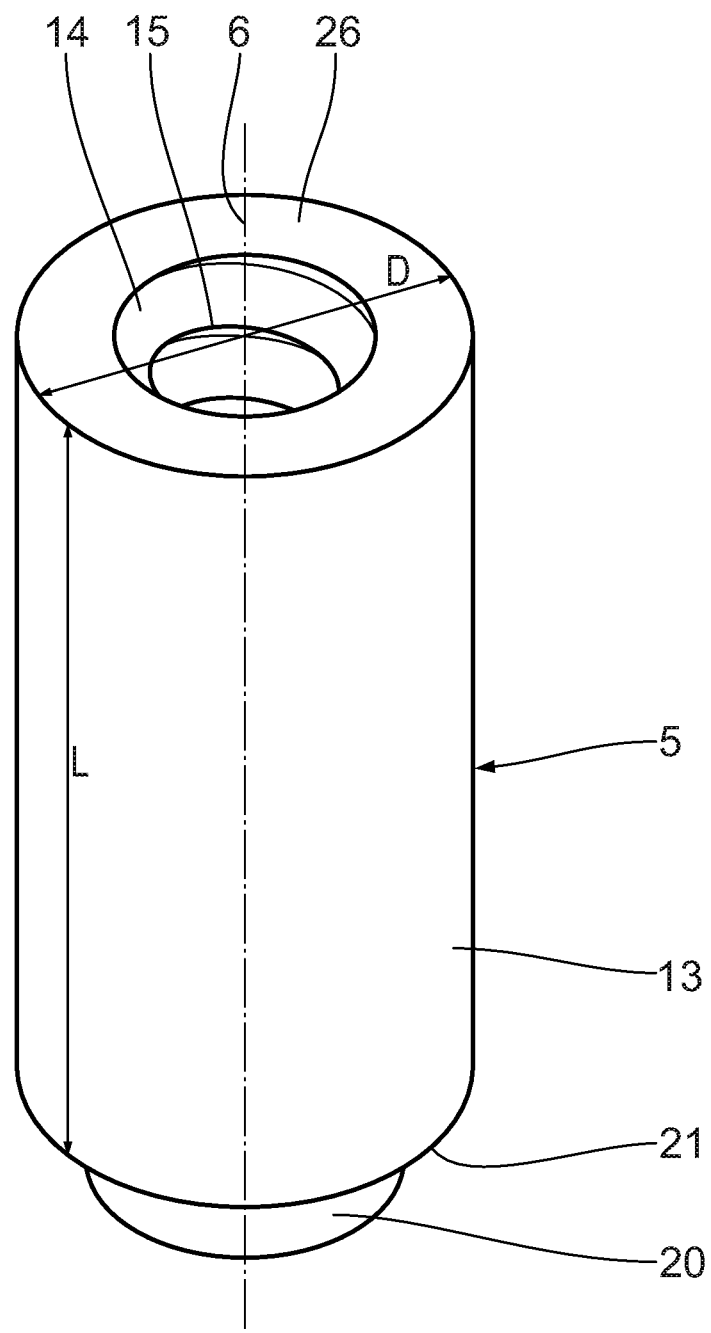
FIG. 3 shows a perspective view of a distance element of the installation unit according to FIG. 2.
Figure 4:
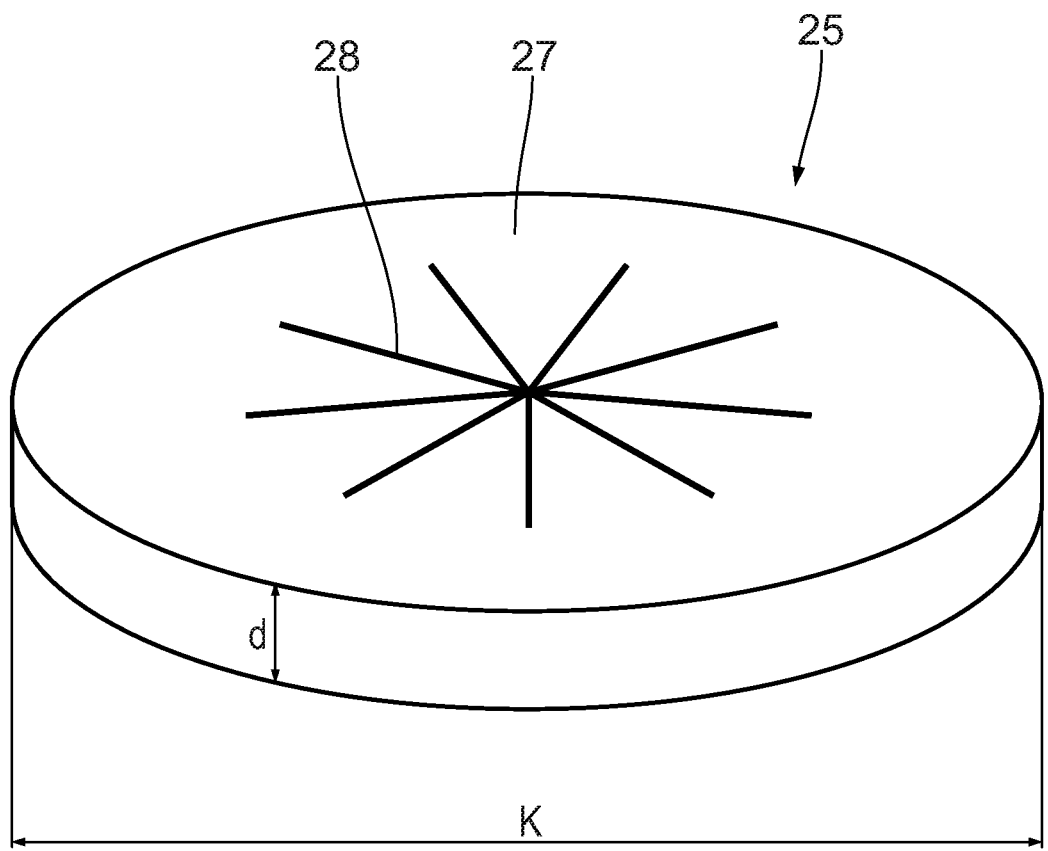
FIG. 4 shows a perspective view of a cover element of the installation unit according to FIG. 2.

In order to realize the above-mentioned advantages, the fixing element 4 and the distance element 5 are provided separate from each other as a two-piece installation assembly. The installation assembly shows the fixing element 4 and an installation unit including the distance element 5. An exemplary installation unit 24 is described with reference to FIGS. 2 to 4. The installation unit 24 has the distance element 5. The installation unit 24 shown in FIG. 2 is suitable for the application in a fixing device which corresponds to the fixing device 1 according to FIG. 1. The distance element 5 of the installation unit 24 differs from the distance element 5 according to FIG. 1 merely in the length L of the sleeve body 13.

Besides the distance element 5, the installation unit 24 comprises a cover element 25 fixed on the distance element 5. The cover element 25 is arranged on the front side on the distance element 5, on its end opposing the insertion section 20. In the region of the intake opening 14, the distance element 5 has a cross-sectional surface 26 (compare FIG. 3). The cross-sectional surface 26 is perpendicular to the central longitudinal axis 6. The cross-section surface 26 corresponds to the circular base surface of the sleeve body 13 and is defined by its diameter D. The cover element 25 is circular and has a circular diameter K (compare FIG. 4), which corresponds to the diameter D. The cover element 25 thus is located within the cross-sectional surface 26. This means that the cover element 25 does not protrude beyond the cross-sectional surface 26. A cross-sectional surface of the installation unit 24 is limited by the diameter D of the cross-sectional surface 26.

The cover element 25 is glued onto the distance element 5 as a laminar adhesive foil. The cover element 25 has a polyimide foil. Additionally, the cover element 25 has an adhesive layer, which is not shown individually. The cover element 25 in total has a thickness between 0.03 mm and 1 mm, in particular between 0.05 mm and 0.5 mm.

The cover element 25 entirely covers the intake opening 14 on the end of the distance element 5 opposite to the insertion section 20. The intake opening 14 thus does not hinder the handling of the installation unit 24. An exposed surface 27 of the cover element 25 configures an installation surface, on which the installation unit 24 and thus the distance element 5 can be held. The holding takes place in a pneumatic manner, wherein the cover element 25 serves as a suction foil.

In the region of the intake opening 14, the cover element 25 has predetermined breaking points 28. The predetermined breaking points 28 are provided as notches arranged in a star-shaped manner in the cover element 25. The predetermined breaking points 28 are carved into the surface 27 of the cover element 25 without material removal. The predetermined breaking points 28 allow for an easy cut-through of the cover element 25 during the insertion of the first fixing section 7 of the fixing element 4. In FIG. 1, the remainders of the cover element 25 can still be seen between the fixing element 4 and the distance element 5. On the inner side of the intake opening 14, foil fragments 29 of the cover element 25, produced during the cut-through, attach within the intake opening 14. A detaching of the cover element 25, in order to connect the fixing element 4 with the distance element 5, is not necessary. Additionally, it is avoided in a consequent manner that the cover element 25, or foil fragments 29 produced during the cut-through, accidentally detach from the distance element 5.

Figure 5:
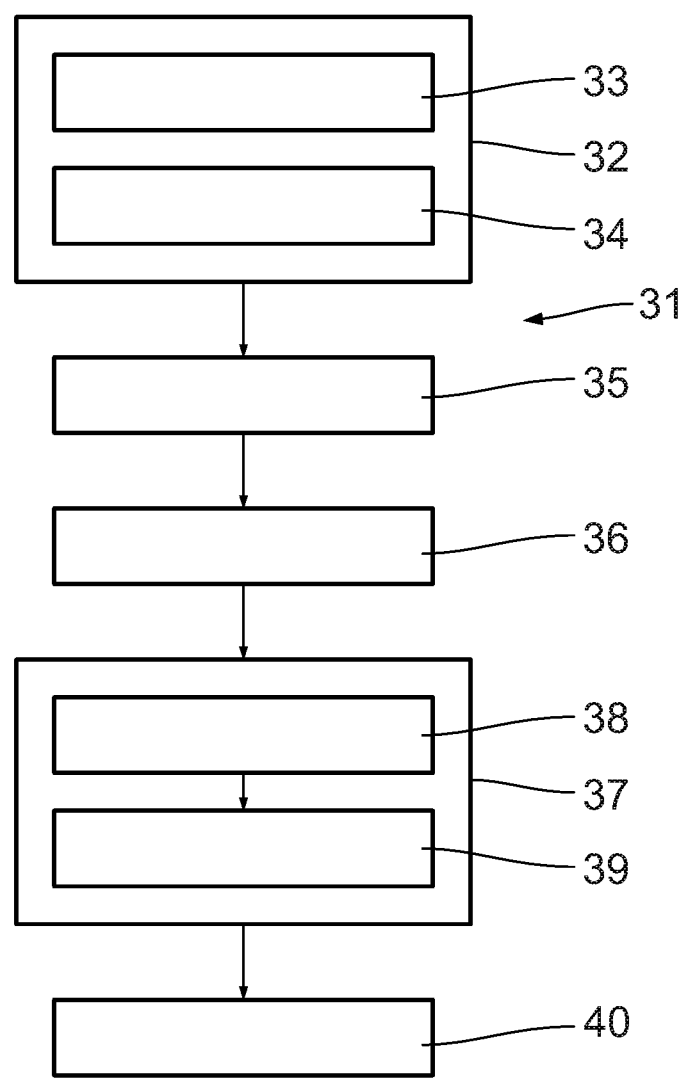
FIG. 5 shows a schematic process flow of a method for the spaced connection of printed circuit boards.

With reference to FIG. 5, a connection method 31 for the spaced connection of printed circuit boards is described.

First of all, in a provision step, the first printed circuit board 2 and the second printed circuit board 3 as well as an at least one installation assembly with one fixing element 4 each and one installation unit 24 each is provided. The length L of each sleeve body 13 is adapted to the distance to be achieved between the printed circuit boards 2, 3 to be connected. The individual steps of the method are carried out independently from each other for the individual installation assemblies. Therefore, in the following, the method steps are described for one single installation assembly only. The method steps are carried out correspondingly for the remaining installation assemblies.

The installation unit 24, composed of the cover element 25 and the distance element 5, generally is provided as a pre-assembled unit. In some embodiments, however, a production step 33 can be provided as a part of the provision step 32. In the production step 33, the cover element 25 configured as an adhesive foil is glued onto the distance element 5. Additionally, in some embodiments, it is provided that the predetermined breaking points 28 are established before or after the gluing onto the distance element 5. The predetermined breaking points 28, for example, are provided in the cover element 25 by carving and/or material removal, for example by means of laser ablation.

The printed circuit boards 2,3, as well, are generally provided in a preassembled manner Some embodiments, however, also comprise a preparation step 34, in which the printed circuit boards 2, 3 are prepared for the installation. For this purpose, the corresponding bores 12, 22 per fixing device 1 are provided in the second printed circuit board 3 or the first printed circuit board 2.

The provision step 32 is followed by an installation step 35. In the installation step 35, the installation unit 24 is held pneumatically on the installation surface 27 with the help of an installation device 50, and is positioned in the respective places of the first printed circuit board 2. The determination of the position of the installation unit 24 in relation to the first printed circuit board 2 takes place automatically and is visually controlled by appropriate cameras. The positioning is improved due to the fact that the cover element 25 does not protrude beyond the distance element 5 and therefore does not hinder a visual control of the current position of the distance element 5.

The installation unit 24 and thus the distance element 5 is also mounted to the first printed circuit board 2 during the installation step 35. For this purpose, first of all, the insertion section 20 is inserted into the reception bore 22 provided therefor until the printed circuit board stop 21 abuts on the surface of the first printed circuit board 2. Subsequently, the distance element 5 is soldered to the printed circuit board 2 with the help of a soldering agent 23. After the installation unit 24 has been fixed to the first printed circuit board 2, the installation device 50 is separated from the installation surface 27.

The installation step 35 is carried out for each of the provided installation units 24. This takes place in a sequential manner for the individual installation units 24. In some embodiments, the installation step 35 can be carried out for multiple installation units 24 in a parallel manner. For this purpose, for example, multiple installation devices 50 can be provided.

After the completion of the installation step 35, a control step 36 follows. In the control step 36, the positioning and fixing of the installation unit 24 to the first printed circuit board 2 is controlled. The control step 36 is carried out visually. The precision of the control step 36 is increased, as well, due to the fact that the cover element 25 does not hinder a visual control of the positioning and fixing of the distance element 5.

The control step 36 is followed by a connection step 37. In the connection step 37, the fixing element 4 is connected with the respective distance element 5. For this purpose, first of all, the cover element 25 is penetrated in the region of the intake opening 14 in a cutting-through step 38. This takes place by the support pin tip 18 of the first fixing section 7 piercing the cover element 25 in the region of the predetermined breaking points 28. After the cutting-through step 38, the entire first fixing section 7 of the fixing element is inserted into the intake opening 14 in an insertion step 39. Here, the support pin latching projections 19 latch with the female thread 15 of the intake opening 14. Foil fragments 29 developing during the cut-through of the cover element 25 attach to the inner side of the intake opening 14, with the result that an insertion and latching of the first fixing section 7 in the intake opening 14 is not hindered.

In a subsequent application step 40, the second printed circuit board 3 is applied by the second fixing section 8 latching with the second printed circuit board 3. For this purpose, the barb-shaped latching projection 11 is guided through the bore 12, with the result that the cylindrical base body 10 comes to rest within the bore 12. The printed circuit board 3 is held between the latching projection 11 and the central section 9.

Figure 6:
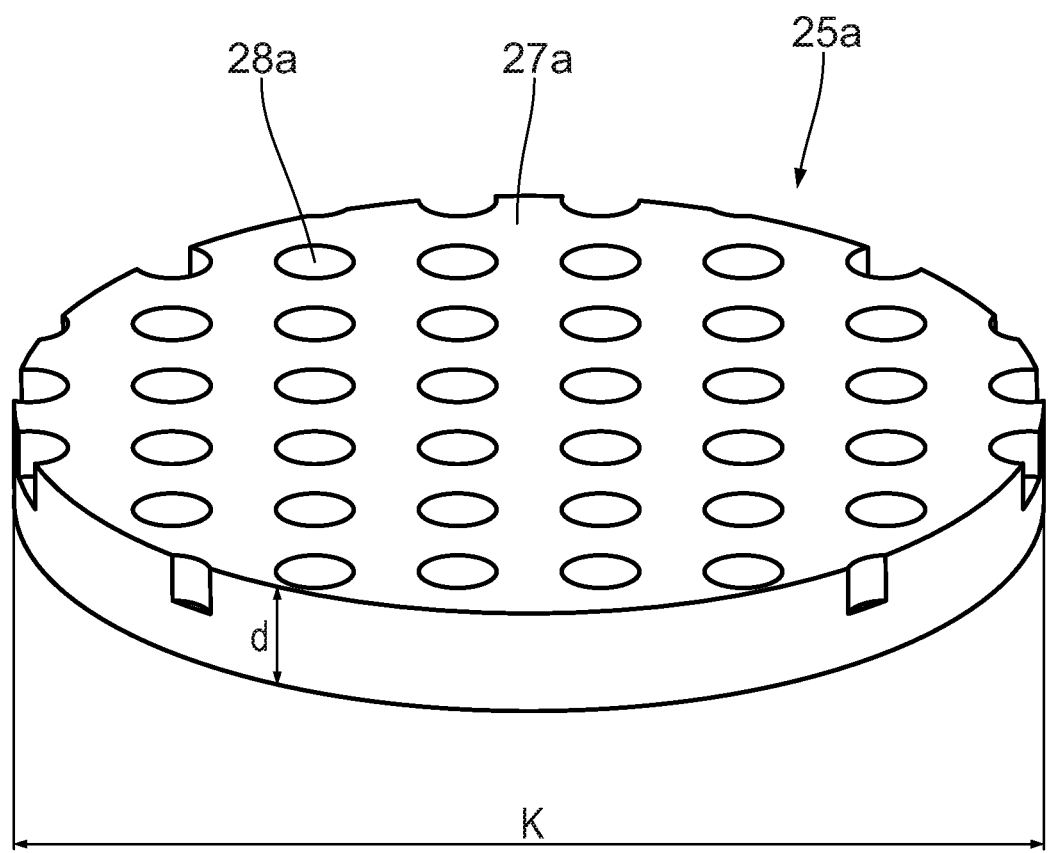
FIG. 6 shows a perspective view of an alternative embodiment of a cover element for an installation unit.

In FIG. 6, another embodiment of a cover element 25a is shown. Components which have already been described in relation to the embodiment in FIGS. 1 to 4 have the same reference numbers. Constructively different, however functionally identical components have the same reference number with a subsequent a.

The cover element 25a, like the cover element 25, is configured as a polyimide adhesive foil. The cover element 25a has a plurality of periodically arranged predetermined breaking points 28a. The predetermined breaking points 28a are arranged at the crossing points of an imaginary rectangular grid. The predetermined breaking points 28a, respectively, are provided as circular recesses in the installation surface 27a. The provision of the predetermined breaking points 28a takes place with the help of a laser. Due to the material removal, the cover element 25a has a reduced thickness in the region of the predetermined breaking points 28a, which simplifies the cut-through of the cover element 25a in the cutting-through step 38.

Yet another embodiment of a cover element, which is not depicted, essentially corresponds to the cover element 25a. The predetermined breaking points, however, are not realized by material removal, but merely by piercing through at the respective points of the grid.

Figure 7:
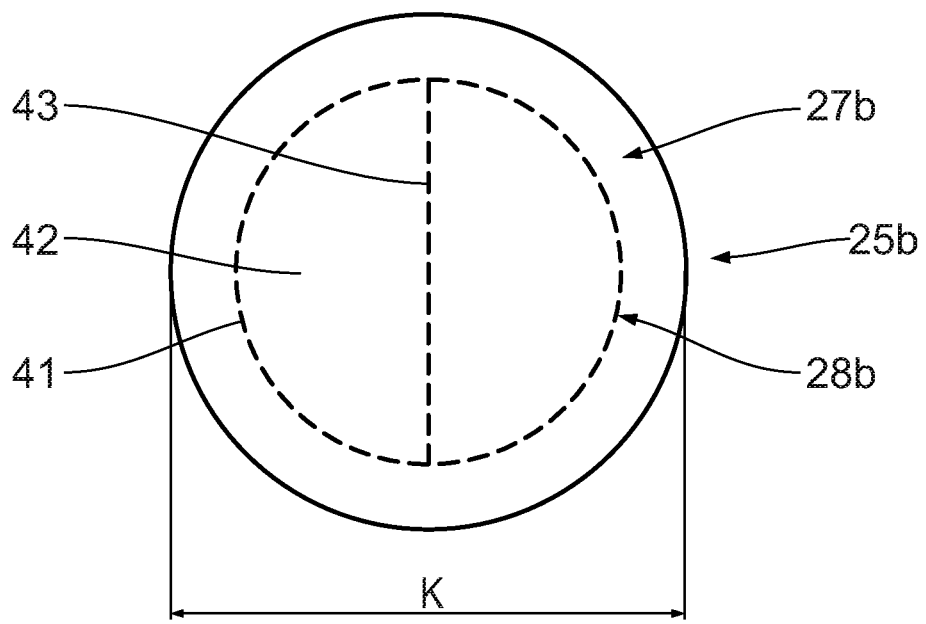
FIG. 7 shows a top view onto a further alternative embodiment of a cover element for an installation unit.

In FIG. 7, a further embodiment of a cover element 25b for the distance element 5 is shown. Components which have already been described in the context of the embodiment in FIGS. 1 to 4 have the same reference numbers. Constructively different, however functionally identical components have the same reference number with a subsequent b.

The cover element 25b corresponds to the cover element 25, except for the configuration of the predetermined breaking points 28b. In the case of the cover element 25b, the predetermined breaking points 28b are configured in the form of a perforation of the cover element 25b. The perforation can be provided in a simple manner, for example, by perforating the cover element 25b with a appropriate perforation device.

The predetermined breaking points 28b are characterized by the fact that they are adapted to the geometry of the cover element 25b as well as to the geometry of the intake opening 14. The intake opening 14 has a circular cross section. The predetermined breaking points 28b have a circular perforation 41, which encloses a circular surface 42 corresponding to the cross section of the intake opening 14. The circular surface 42 is divided into two circle segments of equal size by a perforation line 43 running through the central point of a corresponding circle. This geometry of the predetermined breaking points 28b ensures a reliable cut-through of the cover element 25b in the region of the intake opening 14, without the cover element 25b tearing in its edge regions, as well. A disadvantageous detaching of the cover element 25b during its cut-through thus is avoided in a consequent manner. At the same time, the entire intake opening 14 is reliably released for the insertion of the first fixing section 7.

Figure 8:
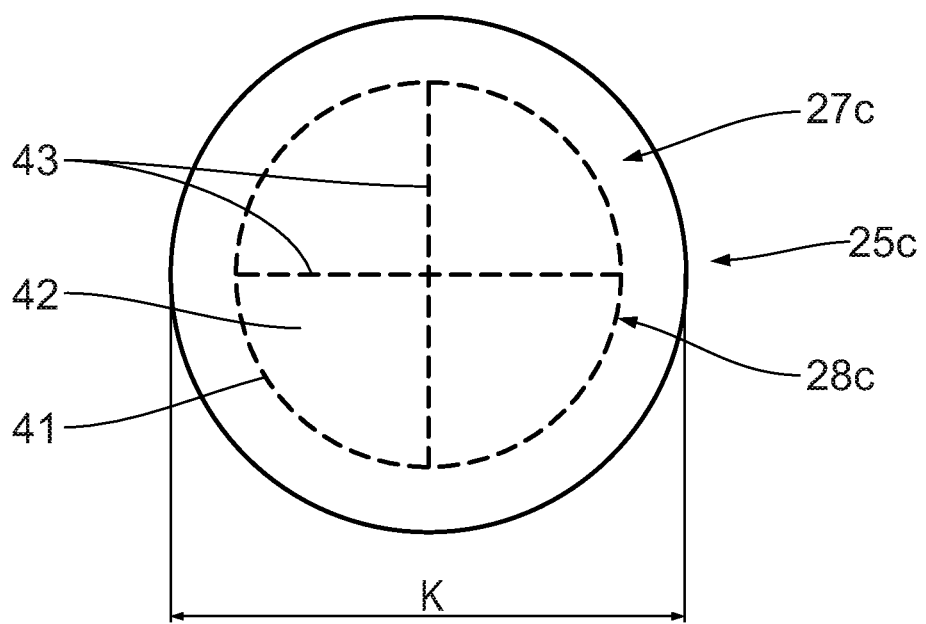
FIG. 8 shows a top view onto yet another alternative embodiment of a cover element for an installation unit.

In FIG. 8, a top view onto another embodiment of a cover element 25c is shown. Components which have already been described in the context of the embodiment in FIG. 7 have the same reference numbers. Constructively different, however functionally identical components have the same reference number with a subsequent c.

The cover element 25c about corresponds to the cover element 25b. The predetermined breaking points 28c have two perforation lines 43 which are perpendicular to each other. Due to this, the circular surface 42 is divided into four circle segments of equal size. The tearing of the cover element 25c during the cut-through of same can be controlled in an even more precise and targeted manner due to this.

In yet other embodiments, which are not shown, the cover element does not have dedicated predetermined breaking points. In some embodiments, these cover elements have a thin thickness d, with the result that a cut-through of the cover element is possible in a simple manner, even without providing predetermined breaking points. In further embodiments, the cover elements without predetermined breaking points have an increased stability. This simplifies the production and the handling of the installation unit. If applicable, the cut-through has to take place with the help of a separate cutting-through step before the connection step. The cut-through, for example, can be carried out with the help of a perforation device.

In other embodiments, which are not shown, the cover element can contain magnetic particles. This allows for holding the installation unit 24 and thus the distance element 5 in the installation step 35 by magnetic means.

In further embodiments, which are not shown, the circular diameter of the cover element does not correspond to the diameter of the distance element in the region of intake opening. For example, the circular diameter of the cover element is between 85% and 95% of the diameter of the cross-sectional surface of the distance element. Due to this, it is ensured that the cover element does not protrude beyond the cross-sectional surface of the distance element. At the same time, the intake opening is entirely covered, with the result that the intake opening does not hinder an installation. Additionally, a contamination of the intake opening is avoided.

Figure 9:
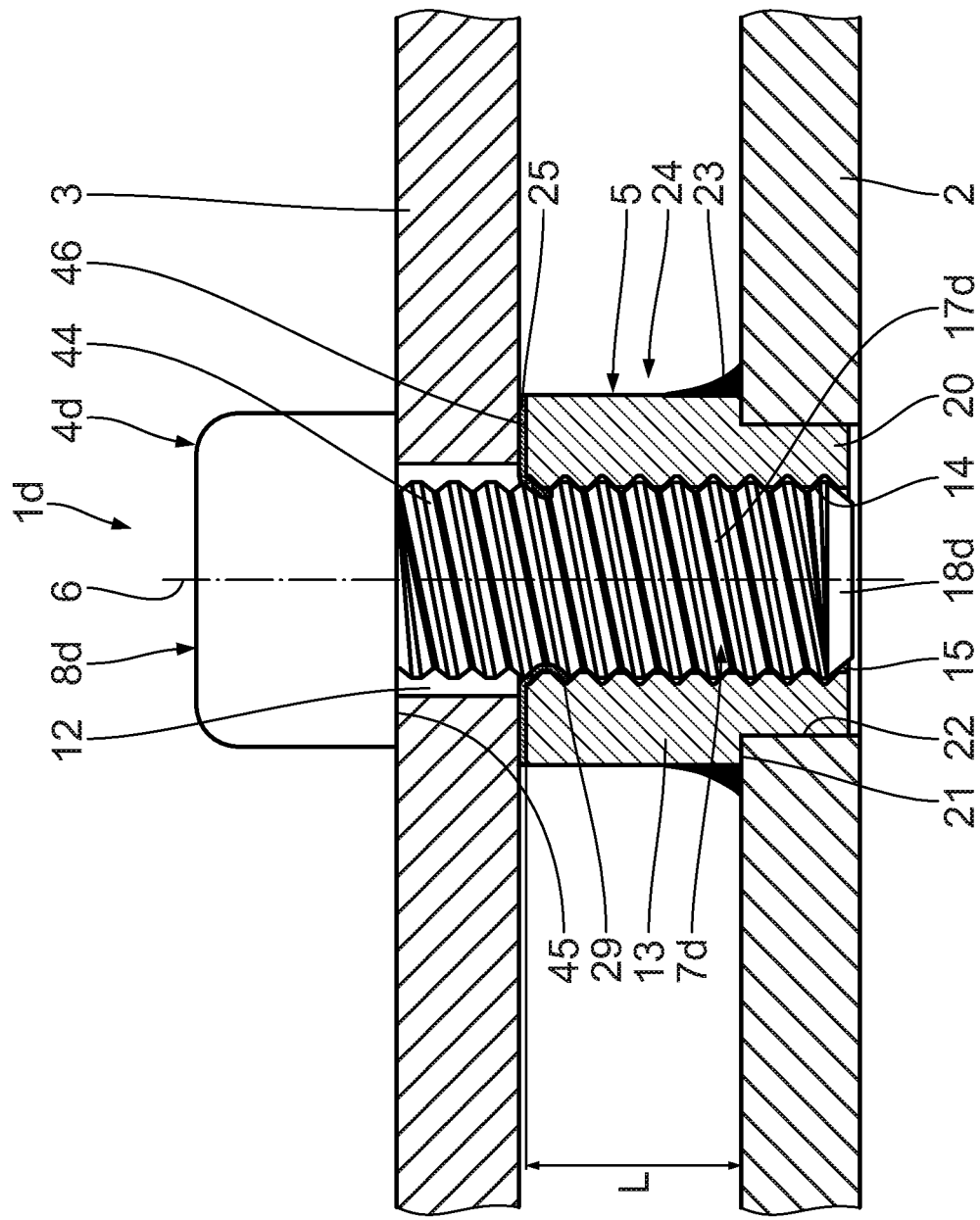
FIG. 9 shows a section through an alternative embodiment of a fixing device, which connects two printed circuit boards with each other in a spaced manner.

In FIG. 9, a section through yet another embodiment of a fixing device 1d is shown, via which the first printed circuit board 2 is connected with the second printed circuit board in a spaced manner Components which have already been described in the context of the embodiment in the FIGS. 1 to 4 have the same reference numbers. Constructively different, however functionally identical components have the same reference number with a subsequent d.

The fixing device 1d differs from the fixing device 1 only by the configuration of the fixing element 4d. The printed circuit boards 2, 3 as well as the installation unit 24 composed of the distance element 5 and the cover element 25 are unchanged.

The fixing element 4d is configured as a screw. The fixing element 4d is made of metal in one piece. The first fixing section 7d has a screw thread 44 on a support pin base body 17d extending along the central longitudinal axis 6. The second fixing section 8d is configured as a screw head.

The screw thread 44 corresponds to the thread 15 of the intake opening 14 of the distance element 5. The first fixing section 7d thus can be screwed in the intake opening 14 after the cut-through of the cover element 25, and is firmly and reliably connected with same due to this. The fixing element 4d configured as a screw, in this case, is screwed from above via the bore 12 through the second printed circuit board 3 into the intake opening 14. The first fixing section 7d with the screw thread 44 thus also extends through the bore 12 of the second printed circuit board 3.

The second fixing section 8d configured as a screw head has holding surfaces 45 facing the second printed circuit board 3. After screwing in the screw thread 44 into the intake opening 14, the holding surfaces 45 rest on the printed circuit board 3 and hold same against the front side 46 of the installation unit 24 facing the fixing element 4d.

As already described above, the printed circuit board 3, in the case of the fixing device 1d, is held between the front side 46 and the holding surfaces 45 of the second fixing section 8d. Accordingly, the fixing element 4d has no central section arranged between the fixing sections 7d, 8d. The two printed circuit boards 2, 3, in the case of the fixing device 1d, are thus spaced essentially by the length L of the sleeve body 13 of the distance element 5.

If the printed circuit boards 2, 3 are connected with the fixing device 1d, the connection method 31 has to be slightly adapted for this purpose. After the positioning and fixing of all installation units in the installation step 35 and the subsequent control in the control step 36, the second printed circuit board 3 first of all is placed to rest onto the front side 46 of the installation unit 24. In doing so, attention has to be paid to the fact that the bore 12 comes to rest above the intake opening 14. Subsequently, the fixing element 4d, with the screw thread 44, is guided through the bore 12 and cuts through the cover element 25. The screw thread 44 is screwed into the thread 15 of the intake opening 14 until the holding surfaces 45 of the second fixing section 8d rest on the printed circuit board 3 and hold same against the front side 46.

In yet other embodiments, which are not shown, also multiple installation units, in particular multiple distance elements can be connected by one single fixing element to configure a fixing device in order to connect multiple printed circuit boards with each other in a spaced manner. If, for example, N printed circuit boards are to be connected with each other, (N−1) installation units are needed. First of all, a first installation unit is positioned on the first printed circuit board and fixed thereon. Subsequently, the second printed circuit board is placed to rest on the front side of the first installation unit, opposite to the first printed circuit board. In doing so, a bore of the second printed circuit board is positioned above the intake opening of the first distance element. Then, a second installation unit is positioned on the second printed circuit board directly above the first distance element, and another printed circuit board is applied. This is repeated until all printed circuit boards are stapled onto each other, respectively in pairs via an installation unit, in a spaced manner Subsequently, a fixing element, which can be configured as a screw, is inserted from above through the topmost printed circuit board into the intake opening of the subjacent distance elements, wherein the respective cover elements are penetrated. In this case, it can be provided that the first fixing section of the fixing element is loosely guided through the upper distance elements and is anchored only in the undermost cover element. Alternatively, a positive connection between the first fixing section and each of the distance elements, for example by threads corresponding with each other, can be realized.

What is claimed is:

1. A method for the spaced connection of printed circuit boards, the method comprising the steps:
    providing at least one installation unit comprising a distance element having an intake opening and the at least one installation unit further comprising a cover element, which covers the intake opening, wherein the cover element is applied onto the distance element as an adhesive foil;
    providing a fixing element per installation unit;
    providing a first printed circuit board,
    providing a second printed circuit board to be connected with the first printed circuit board;
    positioning and fixing the distance element on the first printed circuit board;
    penetrating the cover element in a region of the intake opening;
    inserting the fixing element into the intake opening; and
    connecting the second printed circuit board with the first printed circuit board by the fixing element.

2. The method according to claim 1, wherein the cover element is penetrated in the region of the intake opening with the help of the fixing element.

3. The method according to claim 1, wherein the installation unit, for the positioning and fixing of the distance element on the first printed circuit board, is held on the cover element by an installation device.

4. The method according to claim 1, wherein the installation unit, for the positioning and fixing of the distance element on the first printed circuit board is held pneumatically on the cover element by an installation device.

5. The method according to claim 1, wherein the distance element is soldered with the first printed circuit board.

6. The method according to claim 1, wherein the cover element is located within a cross-sectional surface of the distance element, measured in the region of the intake opening.

7. The method according to claim 1, wherein the cover element has at least one predetermined breaking point in the region of the intake opening.

8. The method according to claim 7, wherein the at least one predetermined breaking point is configured as at least one of a notch and a perforation of the cover element.

9. The method according to claim 1, further comprising a control step for the control of at least one of the positioning and the fixing of the distance element on the first printed circuit board.

10. The method according to claim 1, wherein the adhesive foil is connected to the distance element via an adhesive.

11. The method according to claim 1, wherein the adhesive foil is located at a spaced location from the first printed circuit board and the second printed circuit board prior to the adhesive foil being penetrated and after the adhesive foil is penetrated.

12. The method according to claim 1, wherein the first printed circuit board and the second printed circuit board define a space, at least a portion of the fixing element being located in the space, the portion of the fixing element being located between the second printed circuit board and the adhesive foil, the portion of the fixing element being in contact with the second printed circuit board and the adhesive foil.

13. An installation unit for the spaced connection of two printed circuit boards, the installation unit comprising:
    a distance element including an intake opening for receiving a fixing element; and
    a cover element, which covers the intake opening, wherein the cover element is applied onto the distance element as an adhesive foil.

14. The installation unit according to claim 13, wherein the cover element has a thickness between 0.03 mm and 1 mm.

15. The installation unit according to claim 13, wherein the cover element has a thickness between 0.05 mm and 0.5 mm.

16. The installation unit according to claim 13, wherein the cover element has at least one predetermined breaking point in the region of the intake opening, the adhesive foil is fixed to the distance element via an adhesive.

17. The installation unit according to claim 16, wherein the at least one predetermined breaking point is configured as at least one of a notch and a perforation of the cover element.

18. The installation unit according to claim 16, further comprising a plurality of predetermined breaking points.

19. The installation unit according to claim 13, wherein the cover element is located within a cross-sectional surface of the distance element, measured in the region of the intake opening.

20. The installation unit according to claim 13, wherein the distance element is made of metal in one piece.

21. An installation assembly for the spaced connection of two printed circuit boards, the installation assembly comprising:
    an installation unit comprising a distance element having an intake opening and the installation unit further comprising a cover element, which covers the intake opening, wherein the cover element is applied onto the distance element as an adhesive foil; and
    a fixing element.

22. An installation assembly according to claim 21, wherein the adhesive foil is connected to the distance element via an adhesive.

* * * * *